US012101088B2

(12) United States Patent
Xu et al.

(10) Patent No.: US 12,101,088 B2
(45) Date of Patent: Sep. 24, 2024

(54) FREQUENCY-HALVING LATCH BUFFER CIRCUIT FOR DETERMINISTIC FIELD BUS NETWORK DATA FORWARDING AND APPLICATION THEREOF

(71) Applicant: Zhejiang Sci-Tech University, Hangzhou (CN)

(72) Inventors: Weiqiang Xu, Hangzhou (CN); Chengqun Wang, Hangzhou (CN); Yanjuan Shang, Hangzhou (CN)

(*) Notice: Subject to any disclaimer, the term of this patent is extended or adjusted under 35 U.S.C. 154(b) by 78 days.

(21) Appl. No.: 17/938,733

(22) Filed: Oct. 7, 2022

(65) Prior Publication Data

US 2023/0238962 A1 Jul. 27, 2023

Related U.S. Application Data

(63) Continuation of application No. PCT/CN2022/112953, filed on Aug. 17, 2022.

(30) Foreign Application Priority Data

Jan. 25, 2022 (CN) .................. 202210087578.X

(51) Int. Cl.
*H03K 19/00* (2006.01)
*G06F 13/36* (2006.01)
(Continued)

(52) U.S. Cl.
CPC ..... *H03K 19/017509* (2013.01); *G06F 13/36* (2013.01); *H03K 3/037* (2013.01);
(Continued)

(58) Field of Classification Search
CPC ...... H03K 23/40; H03K 17/005; H03K 3/037; H03K 19/017509; G06F 2213/40; G06F 13/36
See application file for complete search history.

(56) References Cited

U.S. PATENT DOCUMENTS

| 7,437,500 | B2* | 10/2008 | Butt | G11C 7/1057 |
| | | | | 365/194 |
| 10,623,174 | B1* | 4/2020 | Remla | H04L 7/0029 |
| 2012/0033772 | A1* | 2/2012 | Aggarwal | H04L 7/0045 |
| | | | | 375/362 |

* cited by examiner

*Primary Examiner* — Tuan T Lam
(74) *Attorney, Agent, or Firm* — Zhigang Ma

(57) ABSTRACT

The present invention provides a frequency-halving latch circuit for deterministic field bus network data forwarding and application thereof. The frequency-halving latch circuit includes a data buffer equipped with two buffer units; a frequency-halving enable latch signal generation module for generating a first frequency-halving latch signal and a second frequency-halving latch signal with opposite levels, and selecting data buffer units of the data buffer based on the first frequency-halving latch signal, the second frequency-halving latch signal and a receiving enable signal; and a shift register including a first trigger and a second trigger which are initialized to opposite output states, the first trigger and the second trigger is connected to realize a shift operation, and data stored in the data buffer units is finally selected and read based on a low order in the shift register composed of the two triggers and a read enable signal. The frequency-halving latch circuit can be applied to a scenario of deterministic field bus network data forwarding as a same-frequency out-of-phase data cross-clock domain circuit, with high resource utilization rate and stability.

9 Claims, 4 Drawing Sheets

(51) Int. Cl.
*H03K 3/037* (2006.01)
*H03K 17/00* (2006.01)
*H03K 19/0175* (2006.01)
*H03K 23/40* (2006.01)

(52) U.S. Cl.
CPC ........... *H03K 17/005* (2013.01); *H03K 23/40* (2013.01); *G06F 2213/40* (2013.01)

FREQUENCY-HALVING LATCH BUFFER CIRCUIT FOR DETERMINISTIC FIELD BUS NETWORK DATA FORWARDING AND APPLICATION THEREOF

CROSS-REFERENCE TO RELATED APPLICATIONS

This application is a continuation of International Patent Application No. PCT/CN2022/112953 with a filing date of Aug. 17, 2022, designating the United States, now pending, and further claims priority to Chinese patent application CN202210087578.X with a filing date of Jan. 25, 2022. The content of the aforementioned applications, including any intervening amendments thereto, are incorporated herein by reference.

TECHNICAL FIELD

The present invention relates to the field of circuit design, in particular to a frequency-halving latch circuit for deterministic field bus network data forwarding and application thereof.

BACKGROUND

In a field bus control network based on Ethernet technology, the linear network topology is the most widely used network connection method. Data frames are distributed to each control node in a multi-hop manner. In order to ensure the determinacy and low delay of acquisition of data by a control circuit, the processing time of a data frame passing through each control node (one hop) should be deterministic and as short as possible. Due to the use of network transmission, first receiving data from the previous control node, analyzing data frames, acquiring data related to itself, re-framing, and then transmitting new frames to next control node are required in the process of each hop. In this process, since the receiving and transmitting circuits of the control node are implemented by independent PHY chips, and the receiving and transmitting clocks for controlling the PHY chips have the same frequency and are in different phases, a circuit for processing cross-domain clocks needs to be introduced to solve the cross-clock domain problem of same-frequency out-of-phase data. In addition, considering the demand of a control terminal for receiving/transmitting data of the current node, when introducing the cross-clock domain processing circuit, it is necessary to connect a deterministic cross-clock domain digital circuit with few buffer units to store a part of data, so as to realize the data transmission and reception of the control node.

Among the traditional methods of processing data across clock domains, there are mainly asynchronous FIFO, handshake mechanism method, tight coupling method, etc. The asynchronous FIFO method is the most commonly used data cross-domain processing method, but the logic of empty and full signals is complicated, and the control of some signals is difficult to be accurate. Although the handshake mechanism method can accurately transmit data, the delay of transmission is relatively high, which is not suitable for the above application scenarios. The tight coupling method can stably transmit data under asynchronous clocks, but at least 3 memory cells are used, so the resource utilization rate is relatively low.

Therefore, a frequency-halving latch circuit for deterministic field bus network data forwarding with high resource utilization rate, stability and certain buffer capacity is required in response to the above demand.

SUMMARY

The objective of the present invention is to provide a frequency-halving latch circuit for deterministic field bus network data forwarding and application thereof to a scenario of network data forwarding as a same-frequency out-of-phase data cross-clock domain circuit, with high resource utilization rate and stability.

In order to achieve the above objective, this solution provides a frequency-halving buffer circuit for deterministic field bus network data forwarding, including: a data buffer equipped with two buffer units, a write end of the data buffer is connected to a receiving clock signal, a write enable signal and write data respectively, and a read end is connected to a transmitting clock signal, a read enable signal and read data; a frequency-halving enable latch signal generation module for generating a first frequency-halving latch signal and a second frequency-halving latch signal, wherein the levels of the first frequency-halving latch signal and the second frequency-halving latch signal are opposite, and the clock frequency of the first frequency-halving latch signal and the second frequency-halving latch signal is exactly half of a receiving clock frequency, and selecting different data buffer units of the data buffer based on the first frequency-halving latch signal, the second frequency-halving latch signal and a receiving enable signal to write received data; a read enable signal synchronizer including a D trigger for synchronizing the write enable signal written to the data buffer to generate the read enable signal; and a shift register including a first trigger and a second trigger which are initialized to opposite output states, the first trigger and the second trigger is connected to realize a shift operation, and data stored in the data buffer units is finally selected and read based on a low order in the shift register composed of the two triggers and the read enable signal.

In a second aspect, this solution provides application of a frequency-halving latch circuit for deterministic field bus network data forwarding to a scenario of cross-clock domain data transmission as a same-frequency out-of-phase data cross-clock domain circuit.

Compared with the prior art, this technical solution has the following features and beneficial effects: this solution can effectively deal with the cross-domain clock problem of data in the same-frequency out-of-phase data forwarding process, improve the reliability of network data transmission, and reduce packet loss in the process of data transmission; and the buffering time of data at a node is fixed and extremely short, which improves the certainty of entire network transmission. Specifically:

1. The buffer used in this solution only has two buffer units. Which buffer unit the received data should be stored in is determined by means of the frequency-halving enable latch signals, and which buffer unit the data needs to be read from is determined by means of the low-order value of the shift register, so additional counters are not required to calculate read and write addresses. Since the read and write addresses are omitted in this solution, the need for a read and write address synchronizer is correspondingly omitted, thereby greatly simplifying the circuit structure.

2. The logic of writing data is optimized. This solution creatively designs a frequency-halving enable latch signal generation circuit to generate two different frequency-halving latch enable signals, which together with a write enable signal serve as an indication signal of when to latch received data, so as to select different buffer units to store the received data, which reduces resource waste caused by the use of a large number of data registers.

3. The logic of the read and write enable signals are optimized. In this solution, the write enable signal in the receiving clock domain is synchronized to the transmitting clock domain by synchronous triggers to obtain the read enable signal, so that data is implicitly synchronized by means of an explicit synchronization control logic, which ensures that data is transmitted almost in a non-resident memory manner while the processing of data across clock domains is completed. In addition, this solution creatively designs a shift register to determine which buffer unit the data is read from, and omits the use of other complex logic to index a data read unit.

DETAILED DESCRIPTION

A clear and complete description will be made to the technical solutions in the embodiments of the present invention below with reference to the accompanying drawings in the embodiments of the present invention. Apparently, the embodiments described are only part of the embodiments of the present invention, not all of them. Based on the embodiments of the present invention, all other embodiments obtained by those of ordinary skill in the art shall fall within the protection scope of the present invention.

Those skilled in the art should understand that, in the disclosure of the present invention, the orientations or positional relationships indicated by the terms "longitudinal", "lateral", "upper", "lower", "front", "rear", "left", "right", "vertical", "horizontal", "top", "bottom", "inner", "outer", etc. are based on the orientations or positional relationships shown in the accompanying drawings, and are intended to facilitate the description of the present invention and simplify the description only, rather than indicating or implying that the device or element referred to must have a particular orientation or be constructed and operated in a particular orientation, and therefore, these terms cannot be interpreted as limiting the present invention.

It can be understood that the term "a" should be understood as "at least one" or "one or more", that is, in one embodiment, the number of an element may be one, and in another embodiment, the number of the element may be more than one, so the term "one" cannot be understood as a restriction on the number.

This solution provides a frequency-halving latch buffer circuit for deterministic field bus network data forwarding, a buffering method and application. The frequency-halving latch buffer circuit for deterministic field bus network data forwarding improves the existing data cross-clock domain circuit, and can be applied to actual scenarios of deterministic field bus network data forwarding. The frequency-halving latch buffer circuit for deterministic field bus network data forwarding creatively proposes using two different frequency-halving enable latch signals to control write logic of data, and using a shift register to realize read logic of data, thereby realizing cross-clock domain data transmission between a receiving clock domain and a transmitting clock domain.

Figure 1:
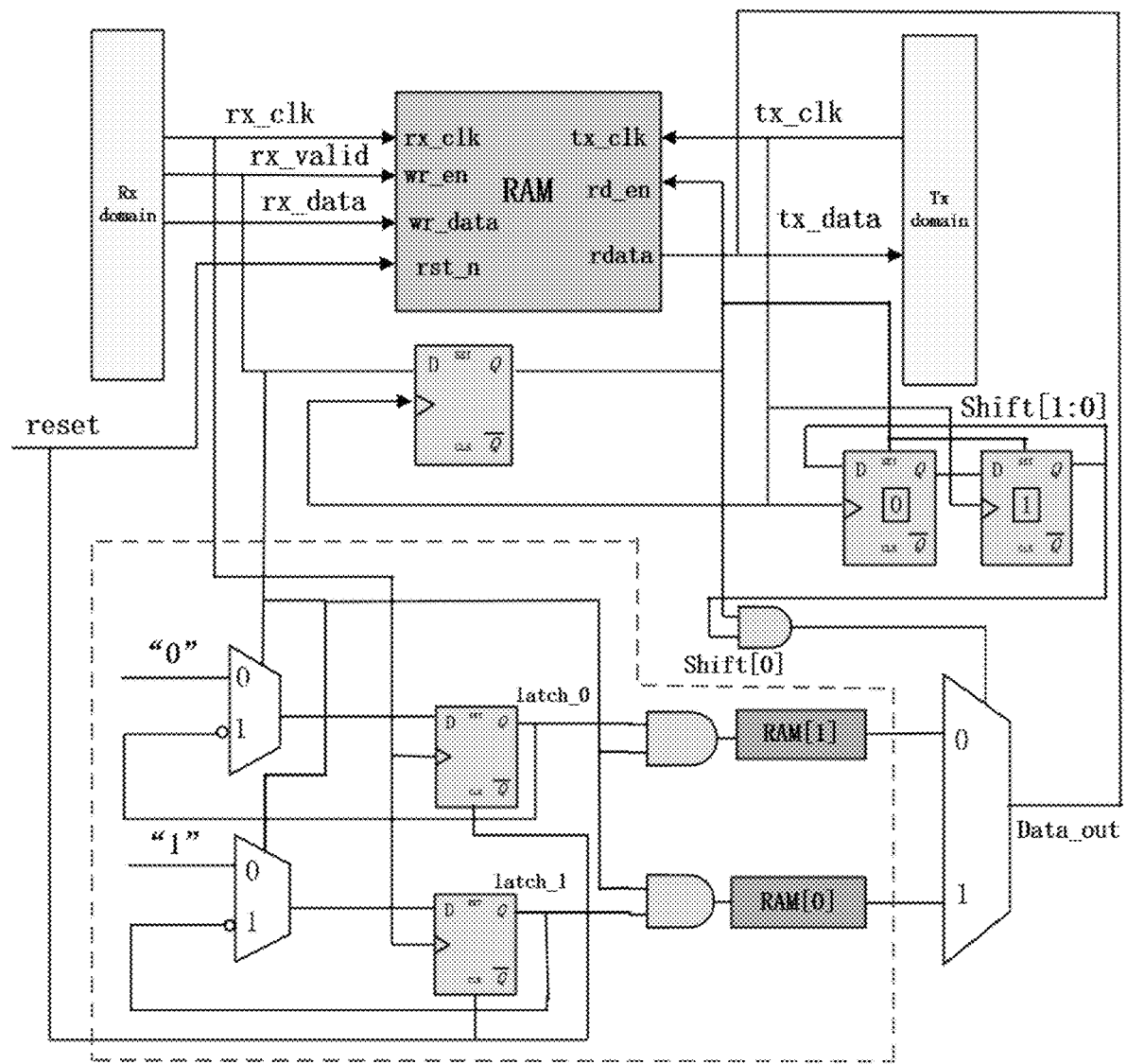
FIG. 1 is a schematic structural illustration of a frequency-halving latch buffer circuit for deterministic field bus network data forwarding provided by this solution.
Figure 2:
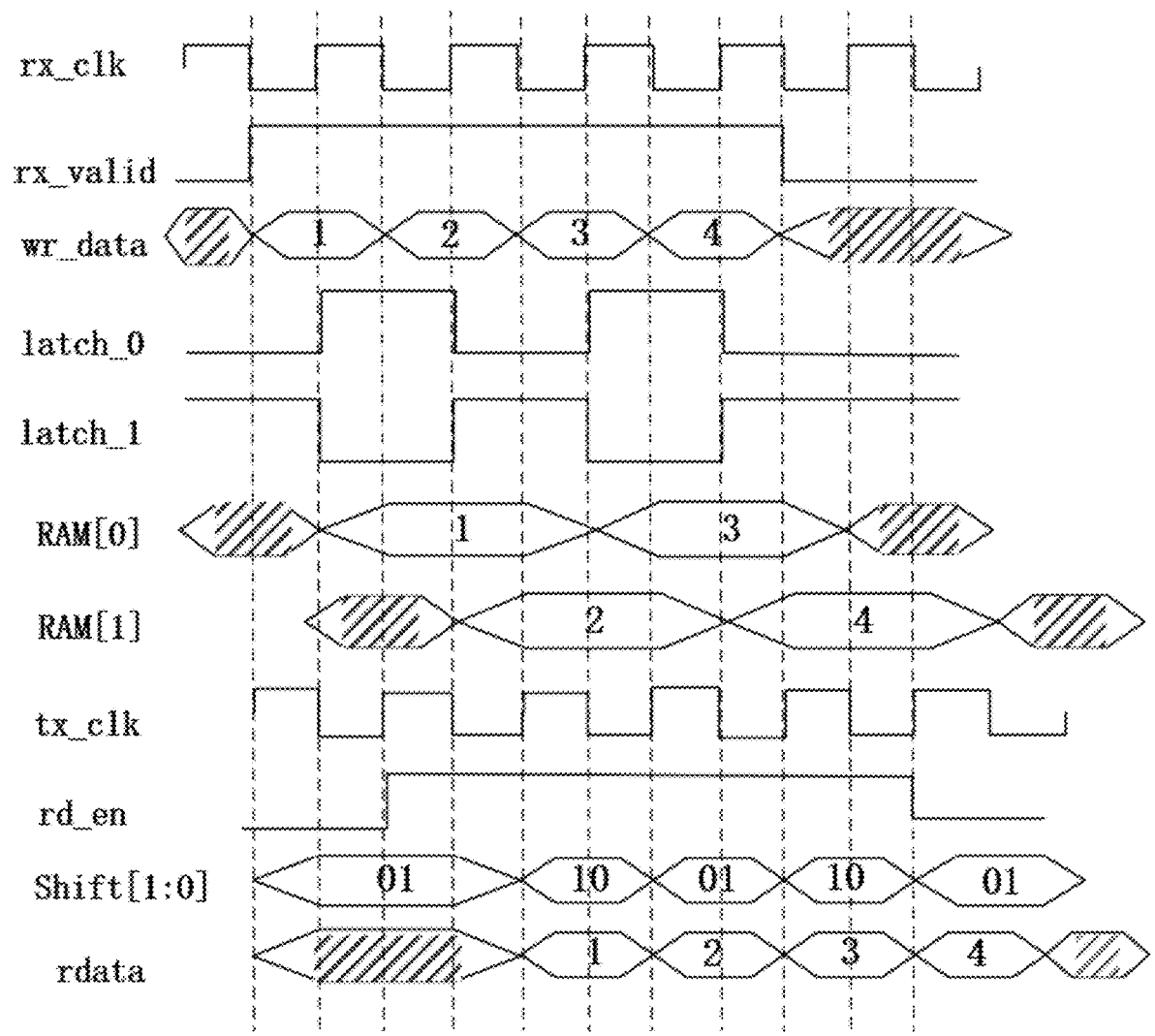
FIG. 2 is a circuit signal timing illustration of the frequency-halving latch buffer circuit for deterministic field bus network data forwarding provided by this solution.

FIG. 1 is a schematic structural illustration of a frequency-halving latch buffer circuit for deterministic field bus network data forwarding provided by this solution. As shown in FIG. 1, the frequency-halving latch buffer circuit for deterministic field bus network data forwarding includes:

a data buffer equipped with two buffer units, a write end of the data buffer is connected to a receiving clock signal rx_clk, a write enable signal wr_en and write data wr_data, and a read end is connected to a transmitting clock signal tx_clk, a read enable signal rd_en and read data rdata;

a frequency-halving enable latch signal generation module for generating a first frequency-halving latch signal latch_0 and a second frequency-halving latch signal latch_1, wherein the levels of the first frequency-halving latch signal latch_0 and the second frequency-halving latch signal latch_1 are opposite, and the clock frequency of the first frequency-halving latch signal latch_0 and the second frequency-halving latch signal latch_1 is exactly half of a receiving clock frequency. Selecting different data buffer units of the data buffer based on the first frequency-halving latch signal latch_0, the second frequency-halving latch signal latch_1 and a receiving enable signal rx_valid to write received data;

a read enable signal synchronizer including a D trigger for synchronizing the write enable signal wr_en written to the data buffer to generate the read enable signal rd_en; and a shift register including a first trigger and a second trigger which are initialized to opposite output states, the first trigger and the second trigger is connected to realize a shift operation, and data rdata stored in the data buffer units is finally selected and read based on a low order shift[0] in the shift register shift[1:0] composed of the two triggers and the read enable signal rd_en.

Regarding the structure of the frequency-halving enable latch signal generation module: specifically, two 2-to-1 multiplexers are arranged in the frequency-halving enable latch signals, an output end of each 2-to-1 multiplexer is connected to a D input end of the D trigger, a signal output by the D trigger is reversed and then connected to an input end 1 of the 2-to-1 multiplexer, and the receiving enable signal rx_valid is connected to a selection control end of each 2-to-1 multiplexer, and wherein initial values of input ends 0 of the two 2-to-1 multiplexers are opposite level signals "0" and "1".

Specifically, the receiving enable signal rx_vaild is used to control the two 2-to-1 multiplexers to select the input end 0 or the input end 1 for signal output, and the output ends of the two 2-to-1 multiplexers are finally connected to the input ends of the triggers, to generate the first frequency-halving latch signal latch_0 and the second frequency-halving latch signal latch_1.

Regarding the structure of the shift register: specifically, the shift register includes a first trigger and a second trigger connected in sequence. The read enable signal rd_en is input to an enable control end of the shift register so that the shifter performs a valid shift operation, thereby changing the output state value of the shift register. The lower order shift[0] of the shift register and the read enable signal rd_en are connected to a control end of the multiplex read selector by a 2-input AND gate signal, the two input ends of the multiplex read selector are respectively connected to the two buffer units RAM[0] and RAM[1], and read data in the buffer unit is selected based on the lower order shift[0] of the shift register and the read enable signal rd_en.

The frequency-halving latch buffer circuit is suitable for synchronizing data of a receiving clock domain to a transmitting clock domain, especially in a transmission scenario of multiple data nodes, the data transmission between two different nodes requires cross-clock domain processing, that is, after a node receives data from the previous node, the data is transmitted to next node after appropriate cross-clock domain processing. This solution provides an improved frequency-halving latch buffer circuit for deterministic field bus network data forwarding, which can be used as a cross-clock domain circuit.

This solution creatively designs a data buffer for asynchronous data transmission. The received data in the receiving clock domain is buffered in the data buffer, and then the data is read and transmitted in the transmitting clock domain to realize asynchronous data transmission. In some embodiments, the data buffer may be an RAM buffer.

The write clock signal rx_clk at the write end of the data buffer is connected to a receiving data clock rx_clk, the write enable signal wr_en is connected to the receiving enable signal rx_valid, and the write data wr_data is received data rx_data that requires cross-clock domain processing. The read clock tx_clk at the output end is connected to a transmitting data clock tx_clk, the read enable signal rd_en is a signal after the receiving enable signal rx_valid is synchronized by the D trigger, and the read data rdata is data tx_data to be transmitted to the next node.

It is worth noting that only two buffer units are arranged in the data buffer of this solution, the creatively designed frequency-halving enable latch signal generation module generates two frequency-halving enable latch signals, and which buffer unit the write data should be stored in is determined based on the frequency-halving enable latch signals; which buffer unit the data should be read from is determined through the low-order value of the creative shift register; therefore, this solution neither needs a counter to calculate read and write addresses, nor needs to consider which address encoding method is used to write read and write address signals. In traditional methods, when cross-clock domain transmission is performed at the read and write addresses in different clock domains, correct exchange of information in two clock domains can be realized only after synchronization by a synchronizer, and then corresponding logic control signals are generated. In this solution, since there are no read and write addresses, the need for synchronization is omitted and then the circuit structure is simplified.

Only two buffer units need to be arranged in the data buffer of this solution, which greatly reduces the number of buffer units and improves the utilization rate of each buffer unit. In order to reasonably control the read and write of data in the buffer units, the frequency-halving enable latch signal generation module in this solution generates a first frequency-halving latch signal and a second frequency-halving latch signal, and based on the first frequency-halving latch signal, the second frequency-halving latch signal and the receiving enable signal, the buffering position of the write data is determined and the time when the received data is written is controlled.

The structure of the frequency-halving enable latch signal generation module is shown in the dotted box of FIG. 1. The selectors in the frequency-halving enable latch signals are 2-to-1 multiplexers, and the initial values of the input ends 0 of the two 2-to-1 multiplexers are designed to be "0" and "1" respectively. Since the generated frequency-halving enable latch signals depend on the receiving enable signal, the change of the frequency-halving enable latch signals may lag for half a clock cycle of receiving valid data. This design cleverly sets the initial values of the input ends 0 of the two 2-to-1 multiplexers to opposite level signals. Once the receiving enable signal rx_valid jumping to a high level and any one of the frequency-halving enable latch signals becoming high-level are detected out, data can be latched into the corresponding buffer unit, and the storage of the first data will not be missed.

When no data is received, the receiving enable signal rx_vaild is low-level, the output end of the multiplexer whose initial value of the input end 0 is "1" outputs a high level, and the output end of the multiplexer whose initial value of the input end 0 is "0" outputs a low level. The output end of each 2-to-1 multiplexer is connected to the D input end of the D trigger, so that the two triggers generate the first frequency-halving latch signal and the second frequency-halving latch signal, respectively. At this time, one of the first frequency-halving latch signal latch0 and the second frequency-halving latch signal latch1 is low-level, the other signal is high-level, and the first frequency-halving latch signal latch0 and the second frequency-halving latch signal latch1 are reversed and then connected to the input end 1 of the corresponding 2-to-1 multiplexer.

When valid data is received, the receiving enable signal rx_vaild is high-level, the high-level receiving enable signal rx_valid controls the two 2-to-1 multiplexers to select the input ends 1 as input signals. Since the input signals at the input ends 1 are reversed values of the previous frequency-halving enable latch signals latch_0 and latch_1, the output values of the two 2-to-1 multiplexers are also reversed values of the previous first frequency-halving enable latch signal latch_0 and second frequency-halving enable latch signal latch_1. After final connection to the D triggers, signal waveforms similar to clock signals will be generated. In other words, the first frequency-halving enable latch signal latch_0 and the second frequency-halving enable latch signal latch_1 are frequency-halving signals of the receiving clock signal when the receiving enable signal rx_vaild is at a high level, and the phases of the two signals differ by one receiving clock cycle.

After the first frequency-halving enable latch signal latch_0 and the second frequency-halving enable latch signal latch_1 are acquired, the first frequency-halving enable latch signal latch_0 and the receiving enable signal rx_vaild are input to the 2-input AND gate to obtain a first selection signal, the second frequency-halving latch signal and the receiving enable signal are input to the 2-input AND gate to obtain a second selection signal, and the buffer unit is selected based on the first selection signal and the second selection signal to write data.

Specifically, when the first selection signal or the second selection signal is high-level, the write data is written into the buffer unit, and the buffer units corresponding to the first selection signal and the second selection signal are different. Specifically, when the first selection signal is high-level, the write data is stored in the second buffer unit of the data buffer; and when the second selection signal is high-level, the write data is stored in the first buffer unit of the data buffer. This is similar to the fact that a write pointer indexes a write address. Directly placing the write data in the corresponding buffer unit omits the use of a complex counter to count the write pointer.

Figure 3:
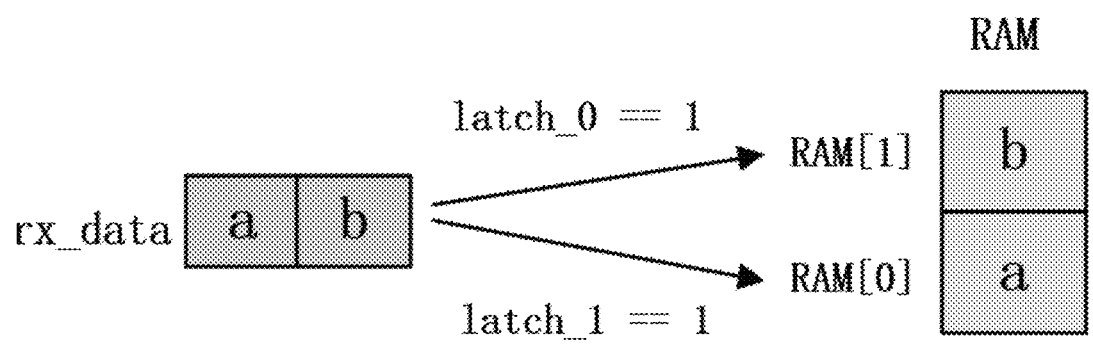
FIG. 3 is a schematic logic illustration of controlling the input of data to buffer units based on frequency-halving latch signals for deterministic field bus network data forwarding.

FIG. 3 shows a schematic process of selecting a buffer unit. As shown in FIG. 3, it is assumed that the received data are a and b. When the received data is valid, the corresponding receiving enable signal is high-level, and the high-level receiving enable signal controls the 2-to-1 multiplexers to input signals from the input ends 1, and receiving clock frequency-halving signals, namely the first frequency-halving enable signals latch_0 and latch_1, are generated. When the latch_0 is high-level, the second data b received will be stored in the second buffer unit RAM[1], and when latch_1 is high-level, the first data a received will be stored in the first buffer unit RAM[0].

What the inventor wants to emphasize again is, in the general cross-clock domain design method based on frequency halving, the halved frequency of a clock is used as a clock trigger edge of a trigger, and data is stored in the trigger. In order not to miss the storage of any valid data, two triggers should be used at the rising edge and falling edge of the frequency-halving clock to store data respectively. This design requires a large number of triggers to realize the synchronous registration of data. The cross-clock domain method proposed in this solution stores data in the data buffer RAM, and only needs to generate two different frequency-halving latch enable signals to realize data synchronization and buffering, which avoids resource waste caused by the use of a large number of triggers.

However, the frequency of a frequency-halving enable latch signal is half of the receiving clock frequency, the difference between the two high levels of the frequency-halving enable latch signal is one receiving clock cycle, data in the buffer unit of the data buffer is updated each time the frequency-halving enable latch signal at the high level is detected out, and each data is stored in the data buffer for 2 receiving clock cycles, so the data must be read in time when the data is stable in the two clock cycles, otherwise the previously stored data will be covered by the updated data to cause data loss.

In this solution, in order to avoid data loss, the read enable signal synchronizer uses a D trigger to establish a connection between the write enable signal wr_en and the read enable signal rd_en, that is, uses a D trigger to synchronize the write enable signal wr_en in the receiving clock domain to the transmitting clock domain to obtain the read enable signal rd_en. Such a design brings the benefit that data resides in the data buffer for a short time. The data is processed across clock domains while ensuring that the data is transmitted in an almost non-resident memory manner, which reduces the processing time of the data at the node and meets the requirement for buffering data.

In the shift register provided by this solution, the output end of the first trigger is connected to the input end of the second trigger, the output end of the second trigger is connected to the input end of the first trigger, and the initial values of the first trigger and the second trigger are set to "0" and "1" states.

When the synchronized read enable signal rd_en is high-level, the read enable signal rd_en is input to the two triggers as a shift enable signal, so that the first trigger and the second trigger start to shift, and the state value of the entire shift register cycles between "01" and "10".

The low order shift[0] of the shift register and the read enable signal rd_en are connected to the selection control end of a 2-to-1 multiplex read selector by a 2-input AND gate, and the two input ends of the multiplex read selector are connected to the two buffer units of the data buffer.

When the low order shift[0] and the read enable signal rd_en are simultaneously high-level, data is read from the first buffer unit RAM[0] of the data buffer and output to data_out. When the low order shift[0] and the read enable signal rd_en are output to be low-level by the AND gate, data is read from the second buffer unit RAM[1] of the data buffer and output to data_out. Finally the output data data_out of the multiplex read selector is connected to a read data end of the data buffer to obtain read data rdata, which is data tx_data to be transmitted to the next node.

Figure 4:
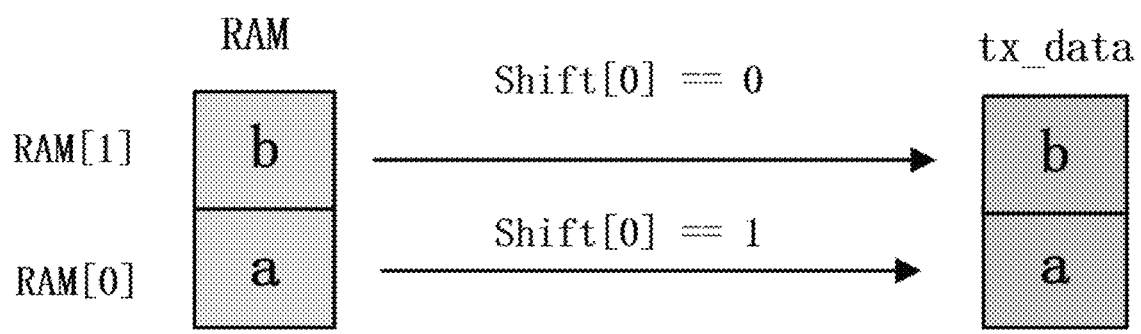
FIG. 4 is a schematic logic illustration of reading data based on a shift register.

FIG. 4 shows a schematic process of reading the buffer unit. As shown in FIG. 4, the two data a and b just received are stored in the first buffer unit RAM[0] and the second buffer unit RAM[1] respectively. When the read enable signal obtained by synchronizing the receiving enable signal is high-level, the shift register starts to shift to obtain different shift state values. According to the state value of the shift register at the lowest order, data are read from different buffer units. When the lowest order shift[0] of the shift register is high-level, the data a is read from RAM[0]. When the lowest order shift[0] of the shift register is low-level, the data b is read from RAM[1]. The whole way of reading data ensures that the order of the data transmitted is consistent with the order of the data received.

It is worth mentioning that the synchronization between the read and write logic in this solution only involves a D trigger, and the data at the read and write ends are implicitly synchronized by explicitly synchronizing read and write enable signals. The received data changes at the falling edge of the receiving clock and remains stable at the rising edge of the receiving clock. In order to stably collect data at the rising edge of the receiving clock and write the same into the data buffer, the generated frequency-halving enable latch signals are reversed for jumping at the rising edge of the receiving clock, which can ensure that the collected write data are stable. The data should also be stable when being read. The write enable signal cannot be directly used to read data. The write enable signal belongs to the receiving clock domain and data should be read in the transmitting clock domain, so the write enable signal in the receiving clock domain jumps to a high level on the rising edge of the transmitting clock through the D synchronization trigger, and data is read according to the read enable signal in the transmitting clock domain, which can ensure the stability of read data to a certain extent. In this way, data is synchronized from the receiving clock domain to the transmitting clock domain, the cross-clock domain processing of the data is completed.

In a second aspect, this solution provides application of a frequency-halving latch buffer circuit for deterministic field bus network data forwarding. The frequency-halving latch buffer circuit for deterministic field bus network data forwarding, provided in this solution, is applied to a scenario of cross-clock domain data transmission as a same-frequency out-of-phase data cross-clock domain circuit, such as a scenario of network data forwarding, or other scenarios of data cross-clock domain.

The present invention is not limited to the above-mentioned best embodiments. Any person can derive other products in various forms under the enlightenment of the present invention. However, regardless of any change in shape or structure, all other technical solutions that are the same or similar to the technical solutions of the present application shall fall within the protection scope of the present invention.

The invention claimed is:

1. A frequency-halving latch buffer circuit for deterministic field bus network data forwarding, comprising:
a data buffer equipped with two buffer units, a write end of the data buffer comprises a write clock signal connected to a receiving clock signal, a write enable signal connected to a receiving enable signal and write data connected to received data, and a read end of the data buffer comprises a read clock connected to a transmitting clock signal, a read enable signal connected to the receiving enable signal through a first D trigger and read data is data to be transmitted to a next node;
a frequency-halving enable latch signal generation module for generating a first frequency-halving latch signal and a second frequency-halving latch signal, wherein the levels of the first frequency-halving latch signal and the second frequency-halving latch signal are opposite, and the clock frequency of the first frequency-halving latch signal and the second frequency-halving latch signal is exactly half of a frequency of the receiving clock signal; selecting different data buffer units of the data buffer based on the first frequency-halving latch signal, the second frequency-halving latch signal and a receiving enable signal to write received data;
a read enable signal synchronizer comprising a D trigger for synchronizing the write enable signal written to the data buffer to generate the read enable signal; and
a shift register comprising a first trigger and a second trigger which are initialized to opposite output states, the first trigger and the second trigger are connected to realize a shift operation, and data stored in the data buffer units is selected and read based on a low order in the shift register composed of the first trigger and the second trigger and the read enable signal.

2. The frequency-halving latch buffer circuit for deterministic field bus network data forwarding according to claim 1, wherein two 2-to-1 multiplexers are arranged in the frequency-halving enable latch signal generation module, an output end of each 2-to-1 multiplexer is connected to a D input end of a second D trigger, a signal output by the second D trigger is reversed and then connected to an input end 1 of each 2-to-1 multiplexer, and the receiving enable signal is connected to a selection control end of each 2-to-1 multiplexer, and wherein initial values of input ends 0 of the two 2-to-1 multiplexers are opposite level signals "0" and "1".

3. The frequency-halving latch buffer circuit for deterministic field bus network data forwarding according to claim 2, wherein the receiving enable signal is used to control the two 2-to-1 multiplexers to select the input end 0 or the input end 1 for signal output, and the output ends of the two 2-to-1 multiplexers are connected to the input ends of the second D triggers, to generate the first frequency-halving latch signal latch_0 and the second frequency-halving latch signal latch_1.

4. The frequency-halving latch buffer circuit for deterministic field bus network data forwarding according to claim 1, wherein the first frequency-halving latch signal and the receiving enable signal are input to a 2-input AND gate to obtain a first selection signal, the second frequency-halving latch signal and the receiving enable signal are input to the 2-input AND gate to obtain a second selection signal, and when the first selection signal or the second selection signal is high-level, different data buffer units are selected to output data.

5. The frequency-halving latch buffer circuit for deterministic field bus network data forwarding according to claim 1, wherein the receiving enable signal of the data buffer is synchronized by the first D trigger to generate the read enable signal.

6. The frequency-halving latch buffer circuit for deterministic field bus network data forwarding according to claim 1, wherein an output end of the first trigger is connected to an input end of the second trigger, an output end of the second trigger is connected to an input end of the first trigger, and initial values of the first trigger and the second trigger are set to "0" and "1" states.

7. The frequency-halving latch buffer circuit for deterministic field bus network data forwarding according to claim 1, wherein the low order of the shift register and the read enable signal are connected to the selection control end of a 2-to-1 multiplexer by a 2-input AND gate signal, and the two input ends of the 2-to-1 multiplexer are connected to the two buffer units of the data buffer.

8. The frequency-halving latch buffer circuit for deterministic field bus network data forwarding according to claim 1, wherein when the low order of the two-order shift register and the read enable signal are simultaneously high-level, data is read from the first buffer unit of the data buffer, and when the low order of the two-order shift register and the read enable signal are output to be low-level through the AND gate, data is read from the second buffer unit of the data buffer.

9. The frequency-halving latch buffer circuit for deterministic field bus network data forwarding according to claim 2, wherein the 2-to-1 multiplexer in the frequency-halving enable latch signal generation module is a selector with two selection input ends.

* * * * *